(12) United States Patent
Yoshida et al.

(10) Patent No.: US 9,146,254 B2
(45) Date of Patent: Sep. 29, 2015

(54) DYNAMIC SENSOR

(71) Applicant: Murata Manufacturing Co., Ltd., Nagaokakyo-shi, Kyoto-fu (JP)

(72) Inventors: Kazuhiro Yoshida, Nagaokakyo (JP); Hiroshi Hamamura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 307 days.

(21) Appl. No.: 13/714,498

(22) Filed: Dec. 14, 2012

(65) Prior Publication Data
US 2014/0000368 A1 Jan. 2, 2014

Related U.S. Application Data

(63) Continuation of application No. PCT/JP2011/063100, filed on Jun. 8, 2011.

(30) Foreign Application Priority Data

Jun. 15, 2010 (JP) ................... 2010-135680

(51) Int. Cl.
*G01P 15/12* (2006.01)
*G01P 15/09* (2006.01)
*B81B 3/00* (2006.01)

(52) U.S. Cl.
CPC .............. *G01P 15/123* (2013.01); *B81B 3/0021* (2013.01); *G01P 15/09* (2013.01); *B81B 2201/0235* (2013.01)

(58) Field of Classification Search
CPC ........ G01L 1/18; G01P 15/135; G01P 15/123

USPC ............................................... 73/514.33, 383
See application file for complete search history.

(56) References Cited

U.S. PATENT DOCUMENTS 4,050,049 A * 9/1977 Youmans .................... 338/47
4,071,838 A * 1/1978 Block ........................ 338/47

(Continued)

FOREIGN PATENT DOCUMENTS

JP 63-305256 A 12/1988
JP 06-082472 A 3/1994

(Continued)

OTHER PUBLICATIONS

Official Communication issued in International Patent Application No. PCT/JP2011/063100, mailed on Jul. 12, 2011.

*Primary Examiner* — Paul West
(74) *Attorney, Agent, or Firm* — Keating & Bennett, LLP

(57) ABSTRACT

A dynamic sensor includes a weight having an H shape in a plan view. The weight includes a first weight portion and a second weight portion which have substantially rectangular parallelepiped shapes and are aligned in a short side direction at an interval and a bridge portion which connects the first and second weight portions and extends in the aligned direction. The bridge portion connects the first and second weight portions at an approximate center thereof in a long side direction. Supports are located in a region between the first and second weight portions where the bridge portion is not provided. The first weight portion is connected to a first support via a first beam and to a second support via a second beam. The second weight portion is connected to the first support via a third beam and to the second support via a fourth beam.

16 Claims, 7 Drawing Sheets

(56) References Cited

U.S. PATENT DOCUMENTS

| | | | |
|---|---|---|---|
| 4,129,042 A * | 12/1978 | Rosvold | 73/727 |
| 4,166,269 A * | 8/1979 | Stephens et al. | 338/3 |
| 6,000,280 A | 12/1999 | Miller et al. | |
| 6,073,484 A * | 6/2000 | Miller et al. | 73/105 |
| 2007/0000323 A1 | 1/2007 | Kuisma | |
| 2009/0183571 A1 | 7/2009 | Mochida | |

FOREIGN PATENT DOCUMENTS

| | | |
|---|---|---|
| JP | 10-010148 A | 1/1998 |
| JP | 11-515092 A | 12/1999 |
| JP | 2007-003211 A | 1/2007 |
| JP | 2008-544243 A | 12/2008 |
| WO | 2006/112051 A1 | 10/2006 |

\* cited by examiner

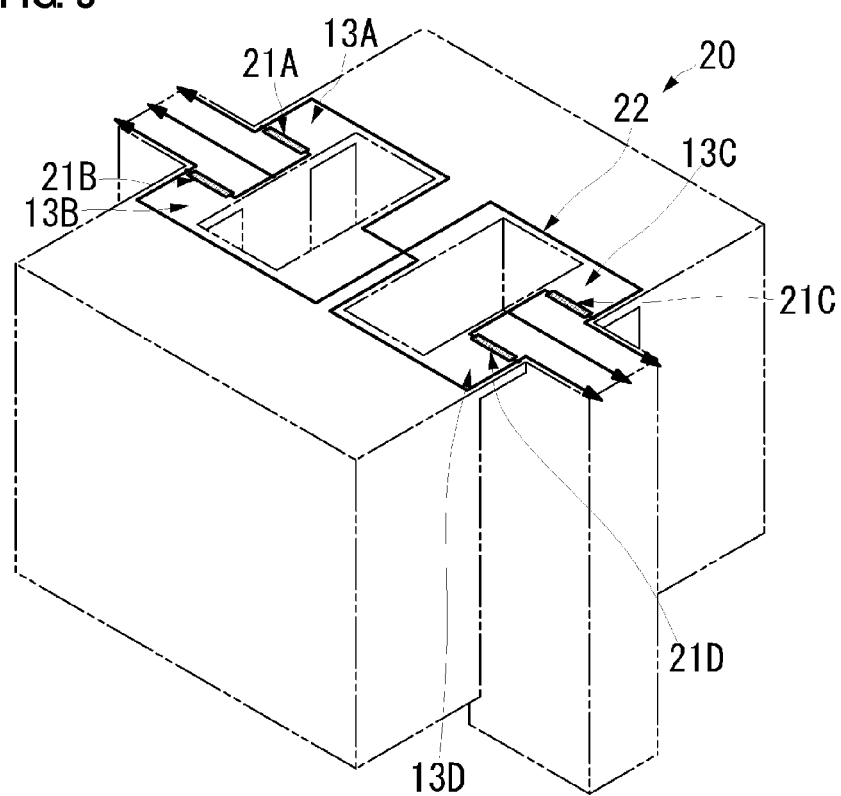

| DIRECTION | NATURAL FREQUENCY [Hz] |
|---|---|
| x-AXIS TRANSLATION | 30732 |
| x-AXIS ROTATION | 59308 |
| z-AXIS TRANSLATION | 101056 |
| z-AXIS ROTATION | 561166 |
| y-AXIS TRANSLATION | 728630 |

DYNAMIC SENSOR

BACKGROUND OF THE INVENTION

1. Field of the Invention

The present invention relates to a dynamic sensor including a piezoresistive element, and in particular, relates to a uniaxial-detection dynamic sensor.

2. Description of the Related Art

Various dynamic sensors using piezoresistive elements have been proposed. For example, in Japanese Unexamined Patent Application Publication No. 63-305256, such a dynamic sensor includes a weight having a rectangular parallelepiped shape, a support arranged so as to surround the weight, and beams rotatably supporting the weight on the support. The beams are provided on both opposing ends of the weight and formed in such a shape as to allow the weight to receive an external force to move.

FIG. 7 is a perspective view of an existing dynamic sensor 10P having the same structure as that of the dynamic sensor disclosed in Japanese Unexamined Patent Application Publication No. 63-305256. In FIG. 7, with regard to a support 12P, only portions connected to beams 13P are shown, and illustration of the other portion is omitted. In addition, the dynamic sensor 10P has an existing general structure, and thus only an outline of the structure will be described.

A weight 11P is formed in a substantially cubic shape. The beams 13P are connected to approximate centers of two opposing sides, respectively, of the weight 11P on the upper surface side. Each beam 13P is formed in such a shape as to allow the weight 11P to move in response to application of an external force. An end of each beam 13P on the side opposite to the side of the beam 13P to which the weight 11P is connected is connected to the support 12P. The weight 11P, the beams 13P, and the support 12P are integrally formed by, for example, etching a silicon substrate on which a piezoresistive element is formed.

However, in the dynamic sensor 10P having the existing structure as shown in FIG. 7, the following problem arises.

In the existing dynamic sensor 10P, when a force is applied in a direction parallel to an axis (an x-axis in FIG. 7) parallel to the two opposing sides on the upper surface side of the weight 11P to which the beams 13P are provided, the weight 11P oscillates about an axis connecting the two beams 13P (a y-axis in FIG. 7). In this case, as shown in FIG. 7, very small regions near corners at four portions where the beams 13P are connected to the weight 11P and the support 12P are stress occurrence regions 30P.

Here, when a physical characteristic such as acceleration due to an applied force is measured with a dynamic sensor, it is necessary to provide a piezoresistive element in each stress occurrence region 30P.

However, in the existing dynamic sensor 10P, each stress occurrence region 30P has a very small surface area, and thus it is not easy to precisely provide a piezoresistive element in this region. Conversely, it is not easy to realize a dynamic sensor that can accurately detect stress to more reliably measure a physical characteristic such as acceleration.

SUMMARY OF THE INVENTION

Therefore, preferred embodiments of the present invention provide a dynamic sensor that can more reliably detect a physical characteristic, such as acceleration, that results from an applied force.

According to a preferred embodiment of the present invention, a dynamic sensor includes a weight that is oscillatably supported by supports and includes beams. The dynamic sensor detects stress occurring in the beams caused by oscillation, and a plurality of piezoresistive elements are provided in the beams to detect a certain physical characteristic based on an applied force.

The weight includes a first weight portion and a second weight portion that are aligned along a first axis direction and each of which preferably has a substantially rectangular parallelepiped shape and a bridge portion. The bridge portion is provided at an approximate center of the first weight portion and the second weight portion in a second axis direction perpendicular to the first axis direction and includes a structure that connects the first weight portion and the second weight portion. In other words, the weight preferably has an "H" shape when seen in a plan view including the first axis and the second axis.

The supports extend along the second axis direction, so as to be arranged with the bridge portion of the weight being located therebetween, and so as to be spaced apart from the weight.

The beams are arranged at positions on both sides of the bridge portion along the second axis direction and extend along the first axis direction to connect the first weight portion to the support and the second weight portion to the support.

In such a configuration, when a force is applied along the first axis direction, stress of the same mode occurs over regions near the connection ends of the beams and is applied to the weight and the support as shown in FIG. 4 (the details will be described later). In other words, stress occurs in wide regions along the connection sides of the beams and is applied to the weight and the support. Thus, the piezoresistive elements are preferably arranged so as to extend along the connection sides, and high accuracy of arrangement of the piezoresistive elements is not required as in the related art. In addition, as described later, with this configuration, greater stress can be detected than with an existing structure. Therefore, it is possible to detect stress more reliably than with the existing structure.

In addition, in the dynamic sensor according to a preferred embodiment of the present invention, the plurality of piezoresistive elements are each provided near a connection end of each beam on the support side.

In this configuration, a specific structure is shown in which the piezoresistive elements are provided in the beams. It has been experimentally determined that when a force is applied along the first axis as described above, greater stress occurs in the ends of the beams on the support side than in the ends of the beams on the first and second weight portion sides. Therefore, when the piezoresistive elements are provided at the ends of the beams on the support side, it is possible to detect stress more reliably.

In addition, in the dynamic sensor according to a preferred embodiment of the present invention, the first weight portion and the second weight portion preferably have the same weight. Alternatively, the first weight portion and the second weight portion may have different weights.

When the first weight portion and the second weight portion connected to each other via the bridge portion change their weight relationship as in these configurations, the center position with respect to the arrangement position of each beam and the center of gravity can be changed. By so doing, even when the dynamic sensor is arranged in the same manner, the detection direction can be changed.

According to various preferred embodiments of the present invention, even with a relatively simple structure, a physical characteristic such as acceleration due to an applied force can be more reliably detected.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a diagram showing an arrangement pattern of piezoresistive elements 21A, 21B, 21C, and 21D and a wiring pattern 22 of the dynamic sensor 10 according to the first preferred embodiment of the present invention.

DETAILED DESCRIPTION OF THE PREFERRED EMBODIMENTS

Figure 1:
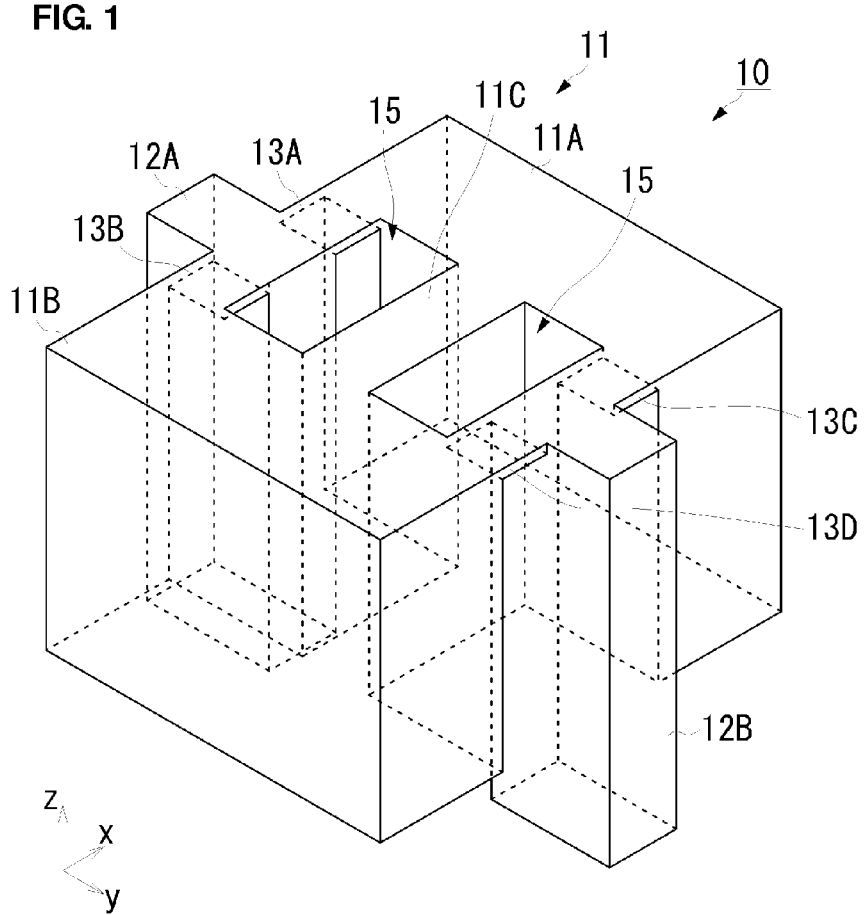
FIG. 1 is a perspective view for illustrating a structure of a dynamic sensor 10 according to a first preferred embodiment of the present invention.
Figure 2A:
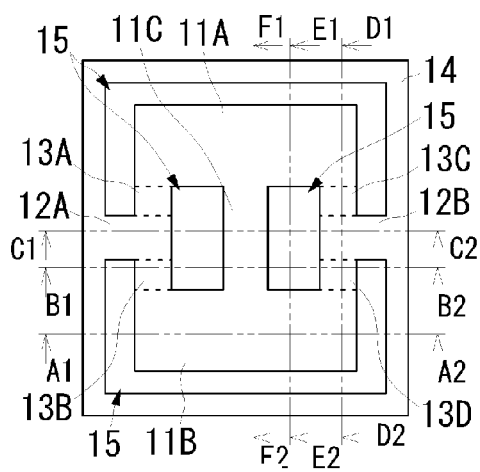
FIGS. 2A-2G are views of each side of the dynamic sensor 10 according to the first preferred embodiment of the present invention.
Figure 2B:
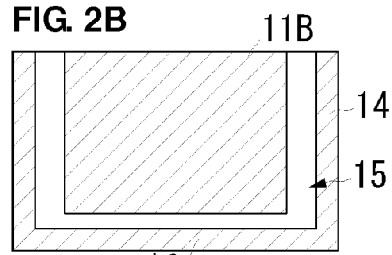
Figure 2C:
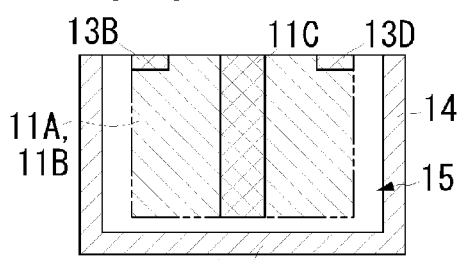
Figure 2D:
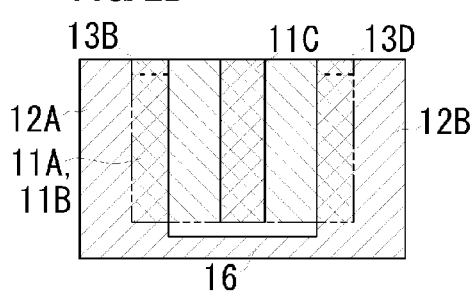
Figure 2E:
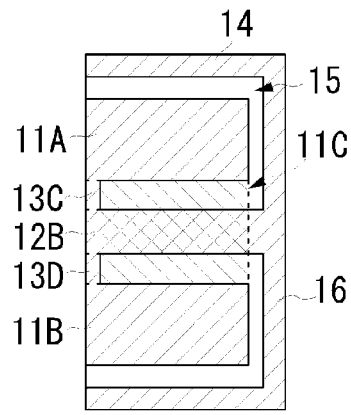
Figure 2F:
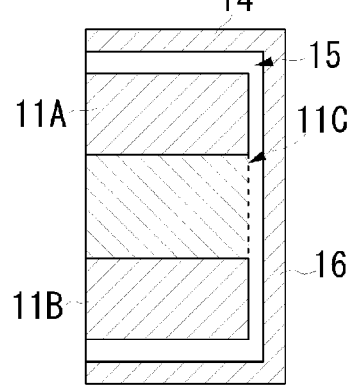
Figure 2G:
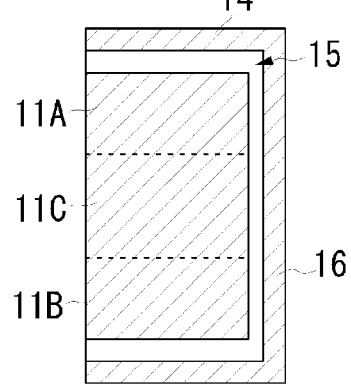

A dynamic sensor according to a first preferred embodiment of the present invention will be described with reference to the drawings. FIG. 1 is a perspective view for illustrating a structure of the dynamic sensor 10 according to the present preferred embodiment. FIGS. 2A-2G are views of each side of the dynamic sensor 10 according to the present preferred embodiment. FIG. 2A is a plan view of the dynamic sensor 10. FIG. 2B is a side cross-sectional view when an A1-A2 cross section of the dynamic sensor 10 in FIG. 2A is seen, FIG. 2C is a side cross-sectional view when a B1-B2 cross section of the dynamic sensor 10 in FIG. 2A is seen, and FIG. 2D is a side cross-sectional view when a C1-C2 cross section of the dynamic sensor 10 in FIG. 2A is seen. FIG. 2E is a side cross-sectional view when a D1-D2 cross section of the dynamic sensor 10 in FIG. 2A is seen, FIG. 2F is a side cross-sectional view when an E1-E2 cross section of the dynamic sensor 10 in FIG. 2A is seen, and FIG. 2G is a side cross-sectional view when an F1-F2 cross section of the dynamic sensor 10 in FIG. 2A is seen. FIG. 3 is a diagram showing an arrangement pattern of piezoresistive elements 21A, 21B, 21C, and 21D and a wiring pattern 22 of the dynamic sensor 10 according to the present preferred embodiment.

The dynamic sensor 10 includes a weight 11 which preferably has an "H" shape in a plan view, namely, when being seen along a z-axis direction in FIG. 1. The weight 11 is preferably formed by conducting each formation process described below, such as pattern etching, on an SOI (Silicon On Insulator) substrate. In the weight 11, a first weight portion 11A and a second weight portion 11B which preferably have substantially rectangular parallelepiped shapes, and a bridge portion 11C preferably having a substantially rectangular parallelepiped shape likewise are integrally formed by this process. Specifically, the weight 11 preferably has the following structure.

The first weight portion 11A and the second weight portion 11B preferably have the same shape and are arranged at a predetermined interval such that short sides thereof in a plan view extend along a first axis (x-axis in FIG. 1) direction. In this case, the first weight portion 11A and the second weight portion 11B are arranged such that long sides thereof in a plan view extend along a second axis (y-axis in FIG. 1) perpendicular to the first axis.

The bridge portion 11C is provided at an approximate center of the first weight portion 11A and the second weight portion 11B in the second axis direction, and connected to both the first weight portion 11A and the second weight portion 11B. The bridge portion 11C preferably has the same thickness (length in the z-axis direction in FIG. 1) as the thicknesses of the first weight portion 11A and the second weight portion 11B. It is noted that the width of the bridge portion 11C is preferably set as appropriate on the basis of the weight of the entire weight 11, the weights of the first weight portion 11A and the second weight portion 11B, the widths of beams 13A, 13B, 13C, and 13D described below, and intervals between them.

Supports 12A and 12B are preferably integral with a housing wall 14 surrounding the weight 11 and preferably have rectangular or substantially rectangular column shapes projecting inwardly from an inner wall surface side of the housing wall 14. The supports 12A and 12B are arranged between the first weight portion 11A and the second weight portion 11B in the x-axis direction of the weight 11. In addition, the supports 12A and 12B are arranged so as to sandwich the bridge portion 11C of the weight 11 in the y-axis direction. In this case, the supports 12A and 12B are arranged at a predetermined interval so as to not be in contact with the weight 11. Furthermore, the heights (heights in the z-axis direction) of the supports 12A and 12B are preferably set so as to be larger than the thickness of the weight 11. Thus, as shown in the drawing, a space 15 is provided between the weight 11 and the supports 12A and 12B and the housing wall 14. A cover 16 is joined to the support 12 and the housing wall 14 so as to not be in contact with the weight 11.

The beams 13A, 13B, 13C, and 13D are preferably arranged to connect the first weight portion 11A and the second weight portion 11B to the supports 12A and 12B. More specifically, the beam 13A connects the vicinity of one end of the first weight portion 11A in the y-axis direction to the support 12A. The beam 13C connects the vicinity of the other end of the first weight portion 11A in the y-axis direction to the support 12B. The beam 13B connects the vicinity of one end of the second weight portion 11B in the y-axis direction to the support 12A. The beam 13D connects the vicinity of the other end of the second weight portion 11B in the y-axis direction to the support 12B.

The beams 13A, 13B, 13C, and 13D preferably have shapes in which all of lengths (lengths along the x-axis), widths (lengths along the y-axis), and thicknesses (lengths along the z-axis) are substantially the same. In addition, the beams 13A, 13B, 13C, and 13D are preferably arranged so as to be symmetrical to each other about the x-axis and the y-axis that pass through the central point of the bridge portion 11C in a plan view (an xy plan view), namely, the central point of the weight 11.

Because of such shapes, the weight 11 is oscillatably supported on the supports 12A and 12B by the beams 13A, 13B, 13C, and 13D. In this case, the weight 11 is arranged such that the center of gravity thereof coincides with the above central point and the gravity is applied from the center of gravity in a direction parallel to the z-axis.

In such a structure, a plurality of the piezoresistive elements 21A, 21B, 21C, and 21D and the wiring electrode pattern are arranged as shown in FIG. 3. A plurality of the piezoresistive elements 21A, 21B, 21C, and 21D are connected to each other via the wiring electrode pattern 22 so as to provide a Wheatstone bridge as shown in FIG. 3. External connection terminals of the Wheatstone bridge are located at predetermined positions in the housing wall 14 via the supports 12A and 12B (not shown).

Specifically, the piezoresistive element 21A is provided near an end of the beam 13A that is connected to the support 12A. The piezoresistive element 21A extends along the y-axis, namely, so as to extend along the connection side between the beam 13A and the support 12A by a length substantially equal to that of the connection side.

The piezoresistive element 21B is provided near an end of the beam 13B that is connected to the support 12A. The piezoresistive element 21B also extends along the y-axis, namely, so as to extend along the connection side between the beam 13B and the support 12A by a length substantially equal to that of the connection side.

Furthermore, the piezoresistive element 21C is provided near an end of the beam 13C that is connected to the support 12B. The piezoresistive element 21C also extends along the y-axis, namely, so as to extend along the connection side between the beam 13C and the support 12B by a length substantially equal to that of the connection side.

Furthermore, the piezoresistive element 21D is provided near an end of the beam 13D that is connected to the support 12B. The piezoresistive element 21D also extends along the y-axis, namely, so as to extend along the connection side between the beam 13D and the support 12B by a length substantially equal to that of the connection side.

Figures 4A, 4B:
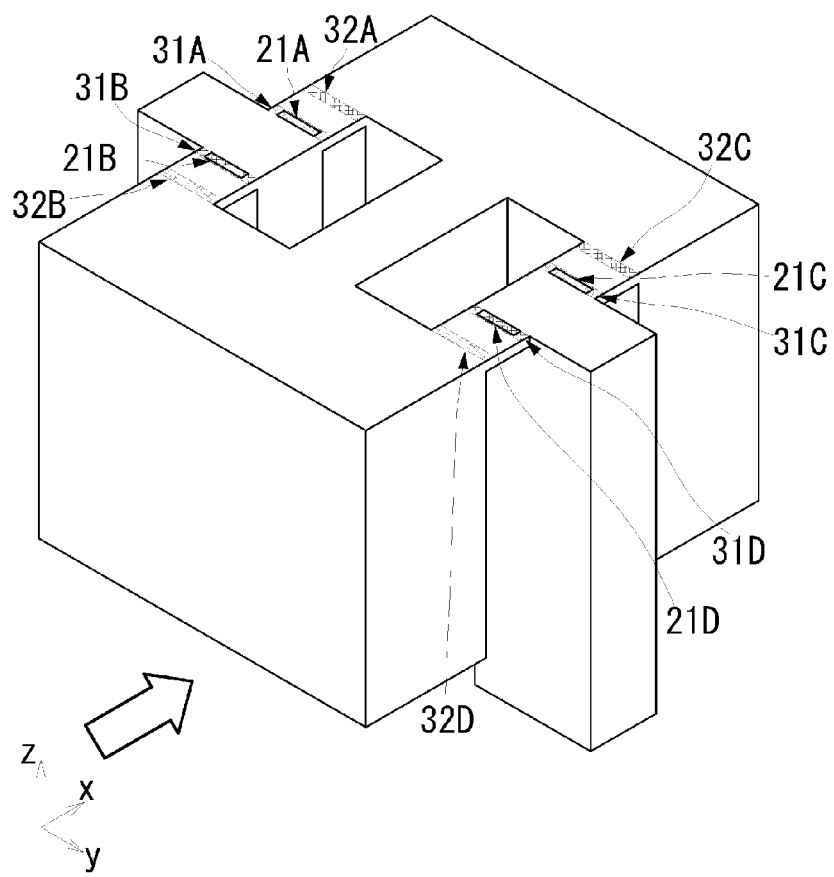
FIGS. 4A and 4B are diagrams showing a detection concept of the dynamic sensor 10 according to the first preferred embodiment of the present invention.

By being configured as described above, the dynamic sensor 10 of the present preferred embodiment can detect a force from the outside as described below. FIGS. 4A and 4B are diagrams illustrating a detection concept of the dynamic sensor according to the present preferred embodiment. FIG. 4A illustrates a state of stress occurrence when a force of x-axis translation is applied, and FIG. 4B is a diagram showing a natural frequency for each direction in which a force is applied. It is noted that the result in FIG. 4B is a result in the case where, with regard to the outer shape of the weight 11, the width (length in the y-axis direction) is preferably set to about 290 µm, the length (length in the x-axis direction) is preferably set to about 400 µm, and the thickness (length in the z-axis direction) is preferably set to about 300 µm, the thickness of each beam is preferably set to about 5 µm, and the resonant frequency (lowest natural frequency) is preferably set to about 30 kHz, for example.

First, in the case where no force is applied from the outside, almost no stress is applied to the beams 13A, 13B, 13C, and 13D. Even when stress is applied thereto, the magnitude and the mode of the stress are the same at the arranged positions of the piezoresistive elements 21A, 21B, 21C, and 21D, and thus the resistant values of the piezoresistive elements 21A, 21B, 21C, and 21D are substantially the same. Because of this, an equilibrium state of the Wheatstone bridge is maintained and a detection voltage does not appear.

Next, when a force that translates along the x-axis is applied, the weight 11 oscillates about the y-axis as a reference axis. If this is a very small oscillation, this can be approximated to translation in the x-axis direction. When the weight 11 oscillates (slightly moves) in the positive direction of the x-axis as described above, stress by compression occurs in a connection end region 31A of the beam 13A to the support 12A, a connection end region 32B of the beam 13B to the second weight portion 11B, a connection end region 31C of the beam 13C to the support 12B, and a connection end region 32D of the beam 13D to the second weight portion 11B, as shown in FIG. 4A. Meanwhile, stress by stretching occurs in a connection end region 32A of the beam 13A to the first weight portion 11A, a connection end region 31B of the beam 13B to the support 12A, a connection end region 32C of the beam 13C to the first weight portion 11A, and a connection end region 31D of the beam 13D to the support 12B.

Here, the piezoresistive elements 21A, 21B, 21C, and 21D are preferably provided in the connection end regions 31A, 31B, 31C, and 31D, respectively, and the resistance values of these elements change in response to applied stress. When the weight 11 oscillates and stress occurs, the equilibrium state of the Wheatstone bridge is lost due to changes of the resistance values of these elements, and a detection voltage corresponding to the stress is outputted. It is noted that when the weight 11 oscillates (slightly moves) in the negative direction of the x-axis due to the oscillation, a detection voltage whose sign is inverted from that of the detection voltage is outputted. Because of such a phenomenon, the force applied in the x-axis direction can be detected.

At that time, in the case with the structure as described above, the natural frequency of the force of x-axis translation is much lower than the natural frequencies of forces in other directions, as shown in FIG. 4B. Specifically, even the natural frequency of x-axis rotation which is second lowest after the natural frequency of the force of x-axis translation is about two times that of the natural frequency of the force of x-axis translation. When such a relationship is established among the natural frequencies, only the force of x-axis translation can be substantially detected. Therefore, with the configuration described above, a uniaxial type dynamic sensor can be realized.

As shown also in FIG. 4A, regions where stress occurs are not very small regions near the corners at the four portions where the beams are connected to the weight and the support as in the related art, and are regions near the connection ends of the beams 13A, 13B, 13C, and 13D that are connected to the weight 11 and the supports 12A and 12B, namely, wide regions along the connection sides of the beams 13A, 13B, 13C, and 13D to the weight 11 and the supports 12A and 12B. Therefore, even when there is variation in formation of the piezoresistive elements 21A, 21B, 21C, and 21D, the piezoresistive elements 21A, 21B, 21C, and 21D are easily influenced by stress. Because of this, stress and further a force applied to the weight 11 can be detected more reliably than in the related art.

Furthermore, although not shown in the drawings, when a force is experimentally applied to the dynamic sensor 10 of the present preferred embodiment and the existing dynamic sensor 10P under the same conditions, stress that is three times greater than that in the existing dynamic sensor 10P occurs in the dynamic sensor 10 of the present preferred embodiment. From such a result as well, it is recognized that the dynamic sensor 10 of the present preferred embodiment can detect stress more reliably than the existing dynamic sensor 10P.

As described above, by using the configuration of the present preferred embodiment, a dynamic sensor that can more reliably detect an applied force can be realized. In this case, as described below, it is almost unnecessary to change the manufacturing process from the process of manufacturing the existing dynamic sensor, and a dynamic sensor having higher detection capability can be realized without using a complicated manufacturing method.

FIGS. 5A-5E are diagrams for illustrating a method for manufacturing the dynamic sensor 10 according to the present preferred embodiment. In these drawings, a shape change by each manufacturing process is shown using the side cross section shown in FIG. 2C described above. It is noted that a description will be given below where the supports 12A and 12B are representatively referred to as support 12, the beams 13A, 13B, 13C, and 13D are representatively referred to as beam 13, and the piezoresistive elements 21A, 21B, 21C, and 21D are representatively referred to as piezoresistive element 21.

Figure 5A:
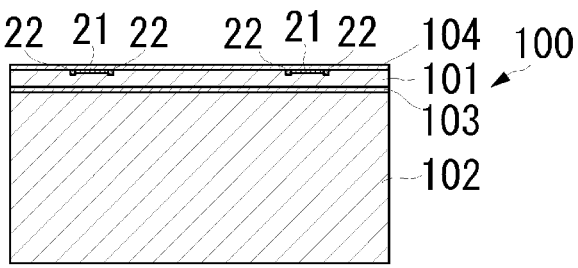
FIGS. 5A-5E are diagrams for illustrating a method for manufacturing the dynamic sensor 10 according to the first preferred embodiment of the present invention.

First, as shown in FIG. 5A, an SOI substrate 100 is prepared. The SOI substrate 100 includes an N type layer silicon substrate 101, a support silicon substrate 102, and an insulating layer 103 interposed therebetween and made from, for example, $SiO_2$ or SiN. Furthermore, in the present preferred embodiment, an insulating layer 104 is formed on a front surface of the silicon substrate 101. Here, the thickness of the laminated silicon substrate 101 and insulating layers 103 and 104 desirably substantially coincides with the thickness of the beam 13.

At a position on the front surface (insulating layer 104) side of the silicon substrate 101 of such an SOI substrate 100 at which position a support 12 side end portion of the beam 13 is to be located, a P type dopant is ion-implanted to form a piezoresistor (P+ layer) which is to be the piezoresistive element 21. Furthermore, a low-resistance wiring region (P++ layer) which is to be the wiring electrode pattern 22 is formed in a predetermined pattern at a position that is substantially as deep as a position of the piezoresistor (P+ layer) in the silicon substrate 101.

Figure 5B:
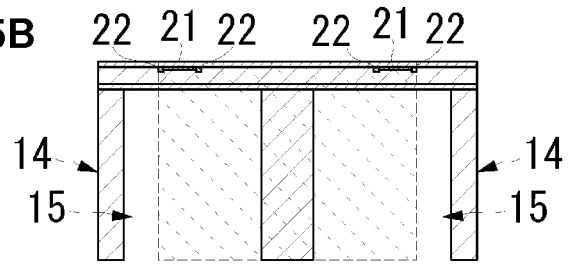

Next, as shown in FIG. 5B, dry etching using an etching gas such as a fluorine type gas (for example, $CF_4$, $C_4F_8$, $SF_6$, etc.) or a chlorine type gas ($Cl_2$) is conducted from the back surface side of the SOI substrate 100 on a region on the support silicon substrate 102 which region is to define the space 15. When such dry etching is conducted, the insulating layer 103 becomes a stopper layer, and the insulating material layer 103, the silicon substrate 101, and the insulating layer 104 are not etched. Because of this process, the weight 11 and the support 12 that include the support silicon substrate 102 as a partial material, and a portion other than the housing wall 14, namely, a portion corresponding to the beam 13 and the space 15, are recessed from the back surface side.

Figure 5C:
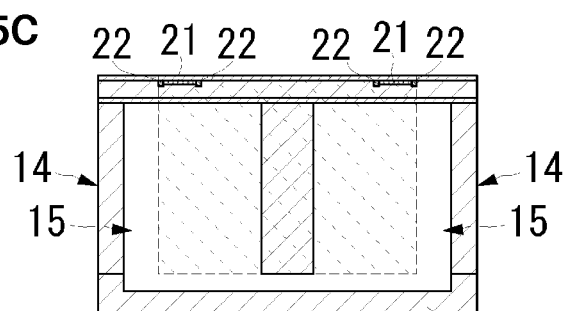

Next, as shown in FIG. 5C, the cover 16 is joined to the back surface side of the SOI substrate 100 in which the recess is formed. The cover 16 is arranged such that the cover 16 comes into contact with the support 12 and the housing wall 14 but does not come into contact with the weight 11 at the center of the recess. It is noted that the material of the cover 16 is desirably the same as that of the support silicon substrate 102.

Figure 5D:
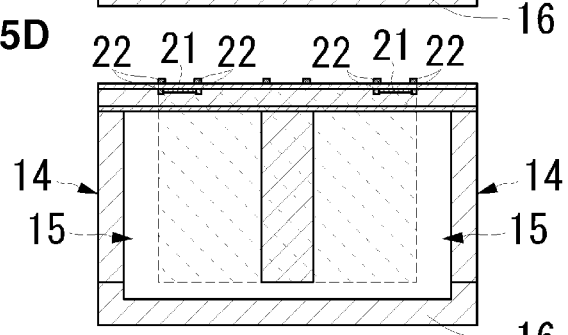

Next, as shown in FIG. 5D, the wiring electrode pattern 22 to provide the Wheatstone bridge described above is formed on the front surface of the insulating layer 104, namely, the front surface of the SOI substrate 100. Although not shown, the wiring electrode pattern 22 is formed so as to be connected to the low-resistance wiring region of the silicon substrate 101.

Figure 5E:
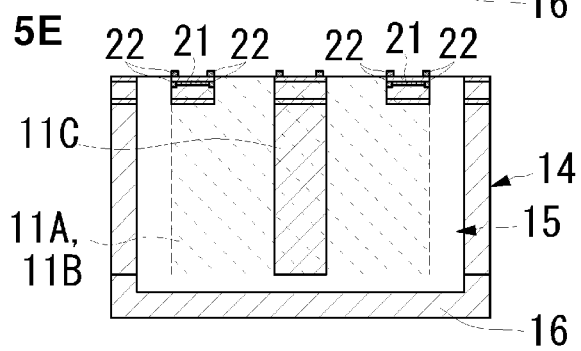

Next, as shown in FIG. 5E, the insulating layer 104, the silicon substrate 101, and the insulating layer 103 are removed by being dry-etched from the front surface side of the SOI substrate 100 such that the weight 11, the support 12, the beam 13, and the housing wall 14 remain. As a result of this process, a structure is realized in which the weight 11 is oscillatably supported by the beam 13 and the support 12 in the space 15 within the housing wall 14. It is noted that an upper cover may be subsequently provided on the front surface side.

Figure 6:
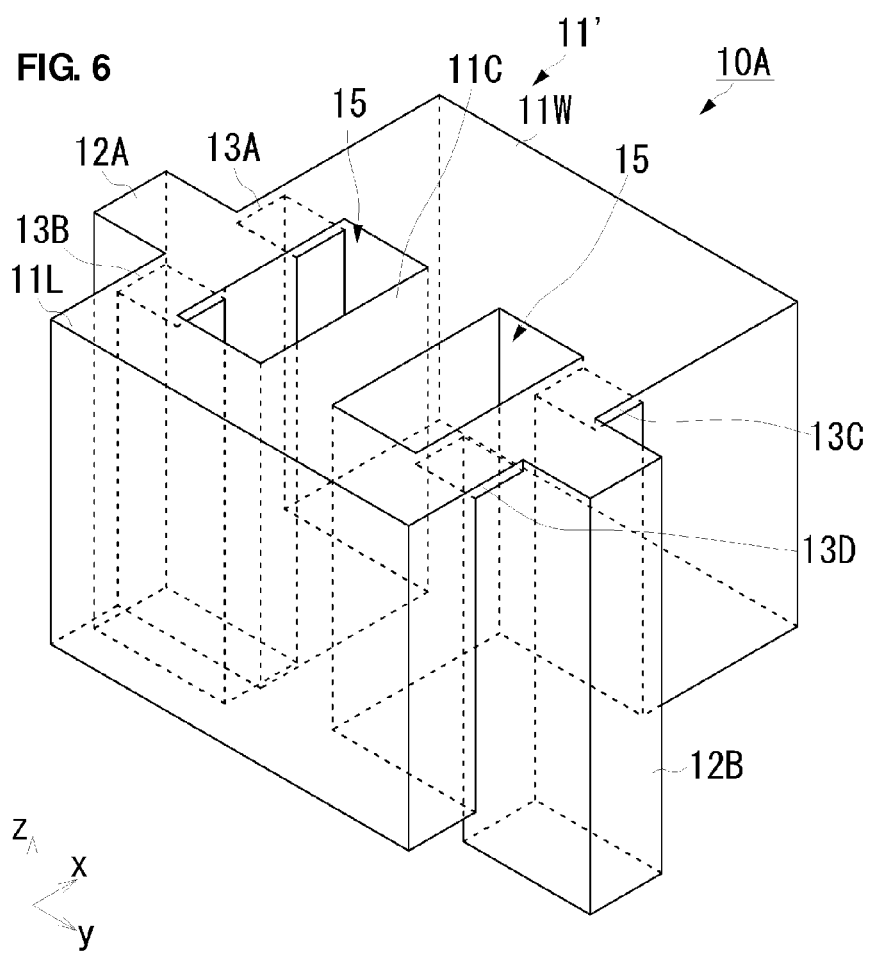
FIG. 6 is a perspective view showing a structure of a dynamic sensor 10A having another configuration according to a preferred embodiment of the present invention.
Figure 7:
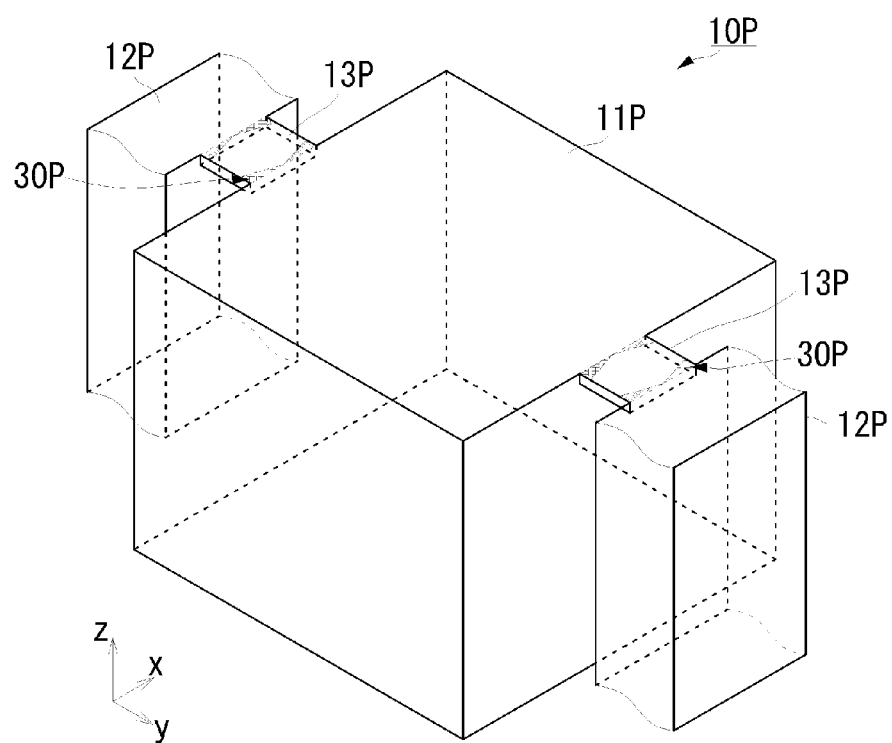
FIG. 7 is a perspective view of an existing dynamic sensor 10P having the same structure as that of a dynamic sensor disclosed in Japanese Unexamined Patent Application Publication No. 63-305256.

It is noted that the shape described above indicates a structure to detect a force of x-axis translation, and a first weight portion 11W and a second weight portion 11L may be made different in shape and weight from each other as shown in FIG. 6. FIG. 6 is a perspective view showing a structure of a dynamic sensor 10A having another configuration of the present preferred embodiment.

As shown in FIG. 6, when the first weight portion 11W and the second weight portion 11L which are supported by the supports 12A and 12B and the beams 13A, 13B, 13C, and 13D are different in weight from each other, the center of gravity of a weight 11' is shifted from the center of the arranged positions of the beams 13A, 13B, 13C, and 13D. When the center position and the center of gravity are shifted from each other as described above, a detection direction shifts. For example, when the first weight portion 11W and the second weight portion 11L have a relationship as in FIG. 6, a direction shifted rotationally from the x-axis direction toward the z-axis direction by a predetermined angle becomes a detection direction. Therefore, by changing the shapes of the first weight portion 11W and the second weight portion 11L, the detection direction can easily be changed. In other words, even when the outer shape and the mounted state are the same, a dynamic sensor having a different direction can be realized.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A dynamic sensor comprising:
a plurality of supports;
a plurality of beams including a plurality of piezoresistive elements provided therein;
a weight that is oscillatably supported on the supports by the beams and is arranged to detect a stress occurring in the beams due to oscillation of the weight to detect a physical characteristic based on an applied force; wherein
the weight includes a first weight portion and a second weight portion which are aligned along a first axis direction and a bridge portion which is provided at an approximate center of the first weight portion and the second weight portion in a second axis direction perpendicular to the first axis direction and which connects the first weight portion and the second weight portion;
the supports extend along the second axis direction such that the bridge portion of the weight is located therebetween, and so as to be spaced apart from the weight; and
the beams are provided on both sides of the bridge portion along the second axis direction and extend along the first axis direction to directly connect the first weight portion to the support and the second weight portion to the support.

2. The dynamic sensor according to claim 1, wherein the plurality of piezoresistive elements are each provided at an area of a connection end of each of the beams on the support side.

3. The dynamic sensor according to claim 1, wherein the first weight portion and the second weight portion have the same weight.

4. The dynamic sensor according to claim 1, wherein the first weight portion and the second weight portion weigh different amounts.

5. The dynamic sensor according to claim 1, wherein each of the first weight portion, the second weight portion and the bridge portion has a rectangular or substantially rectangular parallelepiped shape.

6. The dynamic sensor according to claim 1, wherein the weight is H-shaped or substantially H-shaped.

7. The dynamic sensor according to claim 1, wherein the bridge portion has the same or substantially the same thickness as thicknesses of the first weight portion and the second weight portion.

8. The dynamic sensor according to claim 1, further comprising a housing wall surrounding the weight and integral with the supports.

9. The dynamic sensor according to claim 8, wherein the weight and the supports and the housing wall form a perimeter of a space.

10. The dynamic sensor according to claim 8, wherein a cover is joined to the support and the housing wall so as to not be in contact with the weight.

11. The dynamic sensor according to claim 1, wherein heights of the supports are larger than a thickness of the weight.

12. The dynamic sensor according to claim 1, wherein the beams have the same or substantially the same shape.

13. The dynamic sensor according to claim 1, further comprising a wiring electrode pattern arranged to connect the piezoresistive elements to define a Wheatstone bridge.

14. The dynamic sensor according to claim 1, wherein the piezoresistive elements are provided in connection end regions of the beams.

15. The dynamic sensor according to claim 1, wherein the first weight portion and the second weight portion have the same shapes.

16. The dynamic sensor according to claim 1, wherein the first weight portion and the second weight portion have different shapes.

* * * * *